United States Patent [19]

Wiesendanger et al.

[11] 4,002,973
[45] Jan. 11, 1977

[54] ELEVATOR TESTING SYSTEM

[75] Inventors: Theodore O. Wiesendanger, Wauwatosa; John V. Seals, Brookfield, both of Wis.

[73] Assignee: Armor Elevator Company, Inc., Louisville, Ky.

[22] Filed: Dec. 23, 1975

[21] Appl. No.: 643,684

[52] U.S. Cl. .......................... 324/73 R; 187/29 R; 73/432 SD; 340/19 R
[51] Int. Cl.² ...................... G01R 15/12; B66B 1/00
[58] Field of Search ......... 324/73 R, 73 AT, 160 T; 187/29 R, 29 B; 73/432 SD; 235/150.2, 151.3; 340/19 R, 20; 318/331, 341, 345

[56] References Cited
UNITED STATES PATENTS

| | | | |
|---|---|---|---|
| 3,610,371 | 10/1971 | Abbott | 187/29 R |
| 3,838,891 | 10/1974 | Hamelin | 324/73 R X |
| 3,914,674 | 10/1975 | Maynard | 318/331 |
| 3,961,688 | 6/1976 | Maynard | 187/29 R |

*Primary Examiner*—Palmer C. Demeo
*Assistant Examiner*—Vincent J. Sunderdick
*Attorney, Agent, or Firm*—Andrus, Sceales, Starke & Sawall

[57] ABSTRACT

A testing system is removably connected to a control of an elevator system and selectively operated to perform a plurality of testing sequences. The testing system is removably connected with a closed loop elevator control and selectively and independently provides a number of artificial control signals characteristic of an operating condition for controlling the operation of the elevator system under test. The testing system may be used in a testing sequence with elevator systems employing gated rectifying circuits to accurately monitor gate pulses and other operating functions therein.

31 Claims, 5 Drawing Figures

ELEVATOR TESTING SYSTEM

BACKGROUND OF THE INVENTION

This invention relates to a testing system for an elevator system.

Elevator control systems have evolved into sophisticated, complex controls offering a wide variety of controlled sequences and circuits. Previously, the detection of an improper operating sequence or location of a malfunctioning circuit within an elevator control system was a difficult task requiring maintenance technicians or personnel to expend considerable efforts resulting in substantial down time for the elevator system.

A need exists for a removable portable testing system which a technician can removably connect to an elevator system to provide an accurate check of the operating control at an installation.

SUMMARY OF THE INVENTION

This invention relates to a testing system removably connected to an elevator system for monitoring the operation thereof.

In one aspect of the invention, the testing system is utilized with an elevator system providing a control circuit selectively supplying gating pulses to gated rectifying means operatively supplying controlled amounts of energy from an energy source to motive means operating an elevator car. Specifically, an input of the testing system is removably connected to the elevator control circuit and electrically senses the gating pulses. Such sensed pulses are supplied to a conditioning circuit which responds to each sensed pulse by providing a conditioned pulse having a substantially uniform magnitude. An output of the testing circuit responds to the uniform pulses occurring over a predetermined period of time and provides a substantially average output in response to the conditioned pulses.

The testing system has been found to be extremely desirable in testing elevator systems employing gated rectifying means which control the amount of energy to an elevator motive means thereby controlling the operation of the car.

In a preferred construction, the elevator system provides a first releasable connector having first and second mating terminals with the first terminal connected to the control circuit and the second terminal connected to selectively supply first and second gating pulses during each electrical cycle of an alternating energy source to the gated rectifying means. The testing system provides a third terminal which is removably connected to the first terminal thereby providing a second releasable connector forming an electrical input circuit to the testing system which senses the first and second gating pulses. The conditioning circuit includes first and second switching circuits which selectively transfer between two conditions in response to sensed first and second pulses for providing first and second substantially constant magnitude outputs. A meter is connected to the output of the conditioning circuit and provides a reading representing the substantial average of the first and second substantially constant outputs during each electrical cycle to accurately monitor the functioning of the pulse forming circuitry within the elevator control means.

The testing system thus provides a very desirable field testing sequence in which an actual elevator construction employing gated rectifying means designed to control the operation of the elevator car can be quickly and accurately tested. Such a testing system could be employed with various types of elevators employing gated rectifying means such as in systems which convert an A.C. input having a first frequency to an A.C. output having a second frequency, a D.C. input to an A.C. output, an A.C. input to a D.C. output, or a D.C. input to a D.C. output.

In another aspect of the invention, the testing system is removably connected to an elevator system in which the control means includes a closed loop control operatively receiving an output proportional signal derived from the operation of the motive means for operatively supplying controlled amounts of energy from an energy source to the motive means thereby moving the elevator car in response to a control signal within the control means. Such an elevator installation provides first and second circuits within the control means providing control of the motive means. The test control circuit is removably connected to the circuit means and supplies an artificial control signal characteristic of an operating condition of the elevator system thereby controlling the operation of the motive means. The testing system provides means removably connected to the control means for monitoring the control signal with the elevator system operating in response to the artificial control signal.

The testing system can thus be removably connected to provide operating sequences to the elevator system in accordance with a selected predetermined condition while a selected response within the control system can be monitored as the elevator functions in response to the artificial condition being imposed upon it.

In one application of the testing system, the control means provides first and second circuits removably connected and providing the closed loop control circuit. The testing system provides a test control circuit having third and fourth circuits with the third circuit removably connected to the first circuit and the fourth circuit removably connected to the second circuit. With such removable construction, the test control circuit is selectively operated between a first condition completing the closed loop control circuit permitting a normal elevator operation and a second condition initiating an artificial control signal characteristic of an operating condition of the elevator system which controls the operation of the motive means. The control signal is thus monitored by the testing system both with the elevator operating in response to the closed loop control and with the elevator system operating in response to the artificial control signal.

In another aspect, the control means provides a malfunction monitor operatively controlling the amount of energy supplied from an energy source to motive means operatively controlling the elevator car. With such construction, the test control circuit selectively provides an artificial control signal characteristic of a malfunction condition of the elevator system to control the operation of the motive means. The testing system provides means to monitor a control signal within the control means while the elevator system is operating in response to such artificial control signal.

The testing system has been found to be highly desirable in testing an elevator system which employs malfunction monitoring circuits which are designed to insure continuous safe elevator operation without requiring constant supervision by maintenance personnel. It is therefore desirable that such malfunction monitoring equipment be accurately tested under actual operating sequences in response to an induced malfunction condition to insure proper operation.

The testing system can selectively impose a number of artificial control signals either individually or in combination. Where an elevator under test has gated rectifying means, the test control circuit can selectively supply an artificial gate control signal for operating the gated rectifying means. Where the gated rectifying means provides first and second direction circuits, the test control circuit can selectively provide an artificial gate firing control signal independently to the first and second direction circuits. Where an elevator system under test provides gated rectifying means connected to an armature circuit of the motive means, the test control circuit can provide a selectively varying artificial control signal requiring a variation in the supply of energy to such armature circuit. Where an elevator system under test provides gated rectifying means connected to a field circuit of the motive means, the test control circuit can provide a selectively varying artificial control signal requiring a varying amount of energy supplied to such field circuit.

Where an elevator under test provides gated rectifying means, the testing system can selectively supply an artificial enable control signal permitting the selective operation of the gated rectifying means to operatively supply controlled amounts of energy between a source and the elevator motive means. Where such gated rectifying means includes first and second direction circuits, the test control circuit independently provides an artificial enable signal to the first and second direction circuits. Where the movement of the elevator car is controlled by controlling the energy supplied to an armature circuit of the motive means, the test control circuit can control the operating direction of the car by selectively supplying an artificial enable control signal to a selected one of the first and second direction circuits.

When testing an elevator system which provides motive means having an armature circuit connected to receive controlled amounts of energy, the test control circuit can selectively supply an artificial armature excessive energy control signal to the operating elevator system under test to artificially create a malfunction condition. Where the elevator system under test employs motive means having a field circuit connected to receive controlled amounts of energy, the test control circuit can selectively supply an artificial energy loss control signal to the operating elevator system and artificially create a malfunction condition therein.

Where an elevator system under test employs control means having a power control circuit selectively supplying operating power to a plurality of control circuits within the control means and controlling elevator operation, the test control circuit can selectively supply an artificial power loss control signal to the operating elevator system to artificially create a malfunction condition. Alternatively, the test control circuit can supply an artificial power control signal to the operating elevator system to artificially signal a proper operating power condition.

Where an elevator system under test provides a closed loop control employing an output proportional signal related to the velocity of the car, the test control circuit selectively supplies an artificial excessive speed control signal to the operating elevator system and artificially creates a malfunction condition. Alternatively, the test control circuit selectively supplies an artificial speed control signal to the operating elevator system and artificially signals a proper velocity condition of the elevator car.

In testing an elevator system employing control means having command means providing a command signal indicative of a desired operation of the elevator car and means responding to the command signal and the output proportional signal to provide an error signal operatively coupled to control the operation of the elevator car, the test control circuit selectively supplies an artificial excessive error signal to the operating elevator system and artificially creates a malfunction condition. Alternatively, the test control circuit selectively supplies an artificial error signal to the operating elevator system and artificially signals a proper error signal condition.

When testing an elevator system having control means including a selectively operable leveling pattern control circuit operatively controlling the stopping of an elevator car at a landing, the test control circuit selectively supplies an artificial disable signal operatively removing the leveling pattern control circuit from controlling a stopping sequence of the elevator car. In testing an elevator system control means providing a velocity command circuit selectively commanding a multi-floor run velocity, the test control circuit selectively supplies an artificial velocity command signal commanding a multi-floor run velocity. Where an elevator under test provides a velocity command circuit selectively commanding a one floor run velocity, the test control circuit selectively supplies an artificial velocity command signal commanding a one floor run velocity. Where an elevator system under test provides control means having a normal run selection circuit selectively commanding a normal run sequence, the test control circuit selectively supplies an artificial command signal commanding a normal run sequence. Where an elevator system under test provides control means having an inspection run selection circuit selectively commanding an inspection run sequence, the test control circuit selectively supplies an artificial command signal commanding an inspection run sequence.

Where an elevator system under test provides control means having a selectively operable acceleration command circuit operatively controlling the acceleration of an elevator car, the test control circuit selectively supplies an artificial acceleration command signal operatively controlling the operation of the acceleration command circuit. Where the elevator system under test provides a selectively operable decelerating command circuit operatively controlling the deceleration of the elevator car, the test control circuit selectively supplies an artificial deceleration command signal operatively controlling the operation of the decelerating command circuit.

In another aspect, the testing system can be employed with an elevator system having braking means including a selectively operable braking element permitting vehicle movement and retaining the car in a stopped position. The control means operates in response to a control signal and selectively operates the motive means and further selectively supplies energy from an energy source to the braking means. The control means includes circuit means removably connecting first and second circuits providing control of the braking means. The test control circuit is removably connected to the circuit means and provides an artificial control signal characteristic of an operating condition of the elevator system and controls the operation of the braking means. The testing system provides means removably connectd to the control means and monitors the control signal with the elevator system operating in response to the artificial control signal.

The testing system may desirably be employed with elevator systems having gated rectifying means connected to operatively supply controlled amounts of energy between an energy source and the braking means. When testing such an elevator system, the test control circuit may selectively supply an artificial gate firing control signal for operating the gated rectifying means. The testing system further provides means for selectively varying the artificial control signal and correspondingly varying the energy supplied to a coil operating the braking element of the braking means.

A large number of circuits and/or signals within the elevator system under test can be selectively and independently monitored under a variety of operating conditions, such as set forth above. For example, the following signals or circuits may be selectively monitored within an elevator under test: the operating power circuit to a plurality of control circuits within the control means; the overspeed condition circuit; the over regulation condition circuit; the selective connection circuit for operating power to a plurality of circuits within the control means; the brake energy sensing circuit; the sensed energy circuit from the armature circuit of the motive means; the generated pattern rate command circuit; the generated pattern acceleration command circuit; the generated pattern velocity command circuit; the up and down direction reference command circuits; the generated leveling command circuit; the sensed velocity circuit; the developed error regulation circuit; the regulated error circuit; the firing command to gated rectifying means circuits; the enable command to gated rectifying means circuits; the gate pulse trigger control circuits; the sensed field energy circuit; the positive unfiltered D.C. voltage circuit; the negative unfiltered D.C. voltage circuit; the emergency condition circuit; the emergency landing condition circuit; and various other control circuits and/or signals indicative of numerous circuit operations within the tested elevator system.

It is evident that the large plurality of artificial control signals may be selectively provided independently or in combination thereby resulting in an extremely large number of testing sequences which may be quickly accomplished. The test control circuit can selectively monitor a large number of sensed operating conditions within the tested elevator system by personnel testing an operating elevator system under a variety of selected test sequences in a minimal amount of time. After a testing sequence is completed, the testing system is readily removed and the elevator system is available for normal operation.

BRIEF DESCRIPTION OF THE DRAWINGS

The drawings furnished herewith illustrate a preferred construction of the present invention in which the above advantages and features are clearly disclosed, as well as others which will be clear from the following description.

In the drawings.

DESCRIPTION OF THE PREFERRED ILLUSTRATED EMBODIMENT

Figure 1:
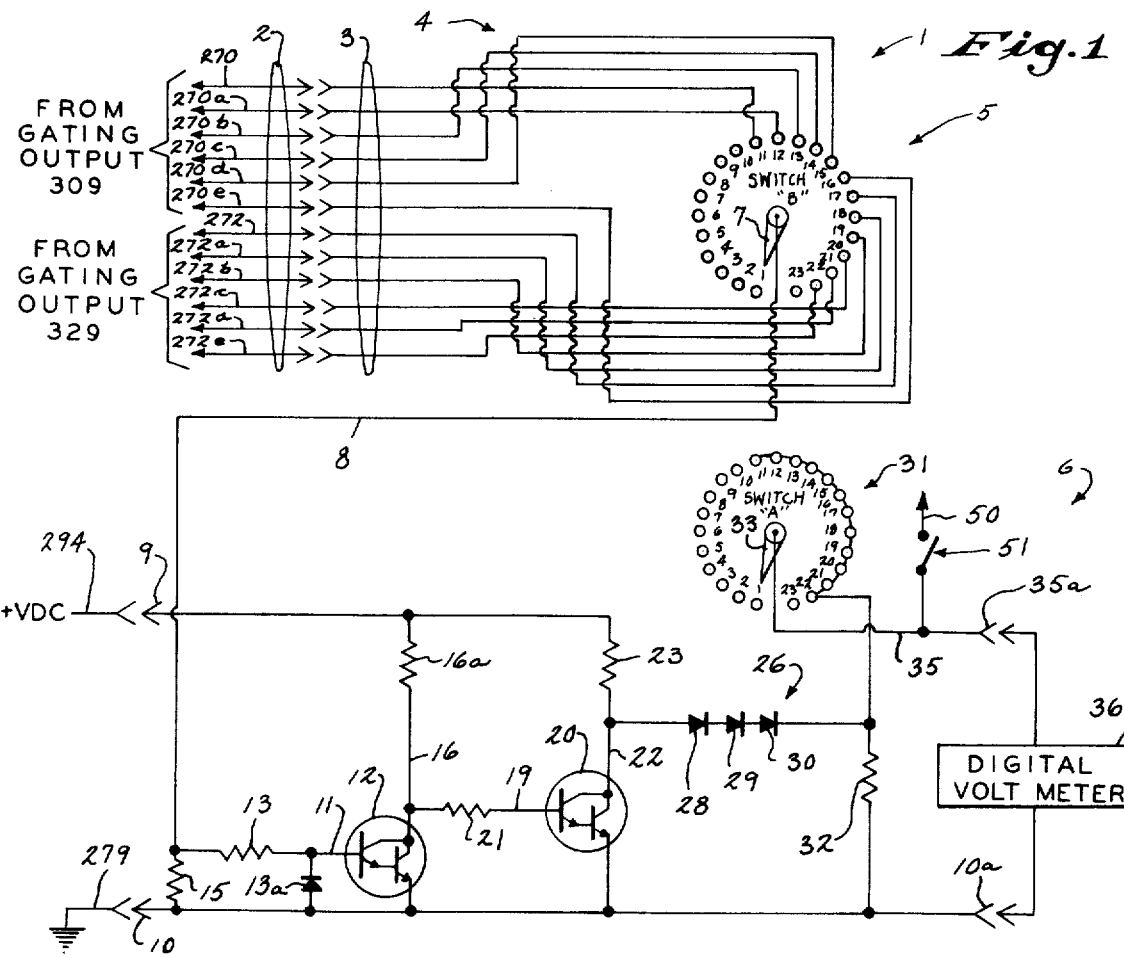
FIG. 1 is an electrical circuit schematic showing a portion of a removable testing system for an elevator.

With reference to the drawings and particularly FIG. 1, a gating pulse testing circuit 1 is removably connectd to selectively monitor the output of a gating control employed within a transportation system to control the operation of a solid state power converter, such as within an elevator as illustrated in the application having Ser. No. 465,271 filed on Apr. 29, 1974 by J. Maynard and entitled "TRANSPORTATION SYSTEM WITH MALFUNCTION MONITOR", which is incorporated herein by reference and hereinafter referred to as the incorporated MALFUNCTION MONITOR system for the sake of brevity. Specifically, the gating control is illustrated in FIG. 8 of the incorporated MALFUNCTION MONITOR system wherein six dual channel modules control a first plurality of controlled rectifiers within a first conduction bridge and a second plurality of controlled rectifiers within a second conduction bridge. Such solid state bridge circuits are electrically controlled by the gating control of FIG. 8 and associated circuitry to supply controlled amounts of energy to a motor operating the transportation system such as an elevator. The gating channels controlling the first bridge circuit as at 267 in FIG. 8 provide six pairs of output leads designated as 270 and 270a through 270e, with each set of output leads connected to a corresponding controlled rectifier and specifically to the gate and cathode circuits thereof. In similar manner, the six channels controlling the second bridge circuit 268 provide six pairs of output leads designated as 272 and 272a through 272e with each set controlling a corresponding controlled rectifier.

In a testing sequence employing the removable testing circuit 1, the gate control leads 270, 270a through 270e, 272 and 272a through 272e in the incorporated MALFUNCTION MONITOR system are open circuited by disconnecting mating connector plugs associated with wiring harnesses normally interconnecting the gating control pulse output transformers with the bridge networks 267 and 268. When a testing sequence is to be initiated by maintenance personnel such as following the installation of the elevator system, the disconnected connector plug or plugs as at 2 which fixedly retain the leads 270, 270a through 270e, 272 and 272a through 272e is reconnected with a testing connector plug 3 provided by the testing system 1. In such manner, the gating output pulses from the elevator system under test are selectively supplied through a wiring harness 4 and a manually operable selector switch 5 to a sensing and conditioning circuit 6.

The gating pulses of selected channels are monitored selectively by the sensing circuit 6 through the manual setting of the selector switch "B" shown at 7. As an example, an electrical connection between the selector switch 7 and the terminal B-11 interconnects gating pulses supplied on the gating lead 270 to an input lead 8 of sensing circuit 6. In similar manner, gating pulses on the leads 270a through 270e, 272 and 272a through 272e are selectively connected to the sensing circuit 6 by switch arm 7 engaging the contacts B-12 through B-22, respectively.

The sensing and conditioning circuit 6 provides a connector 9 which forms a circuit within a connector plug such as 3 and interconnects with a positive potential direct current lead such as 294 found in FIG. 8 of the incorporated MALFUNCTION MONITOR system. In similar manner, a reference potential connector 10 is electrically interconnected with a system ground potential lead such as 279 also found in FIG. 8 of the incorporated MALFUNCTION MONITOR system. A gating pulse circuit is selected for testing by positioning the "B" selector switch 7 and the elevator control activated thereby requiring gating pulses to be supplied to the input circuit 8. Such expected gating pulses are supplied to a base circuit 11 of a Darlington pair type transistor circuit 12 through a resistor 13. The base circuit 11 is connected to a cathode circuit of a diode 13a having an anode circuit connected to the reference lead 10 while a resistor 15 interconnects the input lead 8 with the reference lead 10. The resistors 13 and 15 together with the diode 13a provide protection from abnormal transients for the Darlington circuit 12. An emitter circuit of the second stage of the Darlington circuit 12 is connected to the system neutral lead 10 while a collector circuit 16 is connected to the positive potential voltage lead 9 through a resistor 16a. A base circuit 19 of a second stage Darlington pair transistor type circuit 20 is connected to the collector circuit 16 through a coupling resistor 21. An emitter circuit of the second stage provided by the Darlington circuit 20 is coupled to the neutral lead 10 while a collector circuit 22 is connected to the positive potential voltage lead 9 through a resistor 23.

A unidirectional output circuit 26 interconnects the collector output circuit 22 with a manually operable selector switch designated as "A". Specifically, a series circuit including diodes 28, 29 and 30 interconnect the collector circuit 22 with a terminal A-22 of a manually operable selector switch 31. Specifically, the anode of diode 28 is connected to collector circuit 22 while the anodes of diodes 29 and 30 are connected with the cathode circuits of diodes 28 and 29, respectively, while the cathode circuit of diode 30 is connected to terminal A-22. The terminal A-22 of switch 31 is connected through a resistor 32 to the system neutral lead 10. The switch contacts A-11 through A-22, inclusive, are ganged or interconnected. Thus an output signal provided by circuit 26 will be supplied through a selector arm 33 of switch 31 to an output circuit 35 whenever the manually operated arm 33 is positioned on any one of the contacts A-11 through A-22. In a preferred construction, the switch arm 7 of selector 5 is ganged or connected with switch arm 33 of selector 31 so that the two operate in synchronism. As an example, an electrical connection between switch arm 7 and contact B-12 will correspondingly provide an electrical connection between switch arm 33 and contact A-12. A pair of output connectors 35a and 10a are connected to leads 34 and 10, respectively, and mate with matching connectors provided by a digital voltmeter 36.

As an illustrative example of operation, an operator will disconnect the wiring harness interconnecting the gating control and the controlled rectifiers shown in FIG. 8 of the incorporated MALFUNCTION MONITOR system. The connector plug 2 fixedly retaining the gating leads 270, 270a–270e, 272 and 272a–272e is connected with the connector plug 3. The switch arm 7 is manually positioned to form an electrical circuit with a selected gating channel. For example, the contact B-11 may be connected into circuit to form a connection from the gate firing lead 270 through the electrical connection provided by plugs 2 and 3, the contact B-11, the switch arm 7 to the input 8. As described more fully hereinafter, the removable test system will condition the elevator system to either operate automatically or under selected manual control by the test operator so that the gating control is commanded to supply gating pulses to the testing circuit 1.

Figure 2:
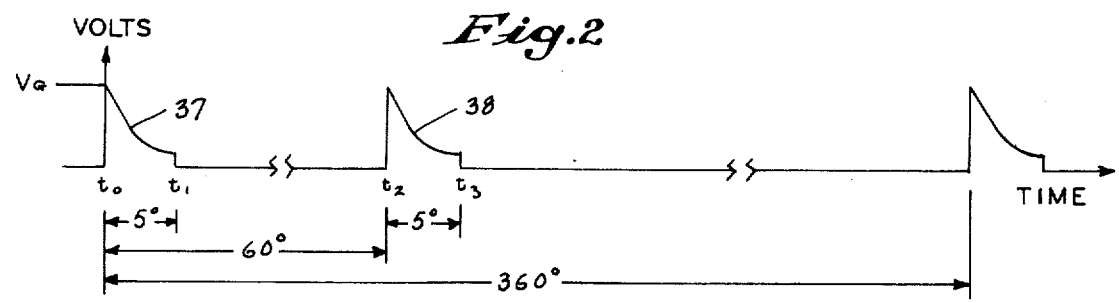
FIG. 2 is a diagrammatical graphical illustration showing the voltage waveforms of sensed gating pulses supplied from an elevator control system under test.

With the gating control supplying gating pulses for the first rectifier bridge, a series of periodically appearing pulses will appear at the input lead 8 in a waveform as illustrated in FIG. 2. During a normal operation, the gating control will supply a pair of pulses 37 and 38 during each electrical cycle having a peak magnitude designated as $V_g$. The gating control providing the pair of gating pulses 37 and 38 is more fully described in the application having Ser. No. 596,668 filed on Jul. 17, 1975 by J. Maynard and the U.S. Pat. No. 3,914,674 issued on Oct. 21, 1975, and such application and patent are incorporated herein by reference.

Figure 3:
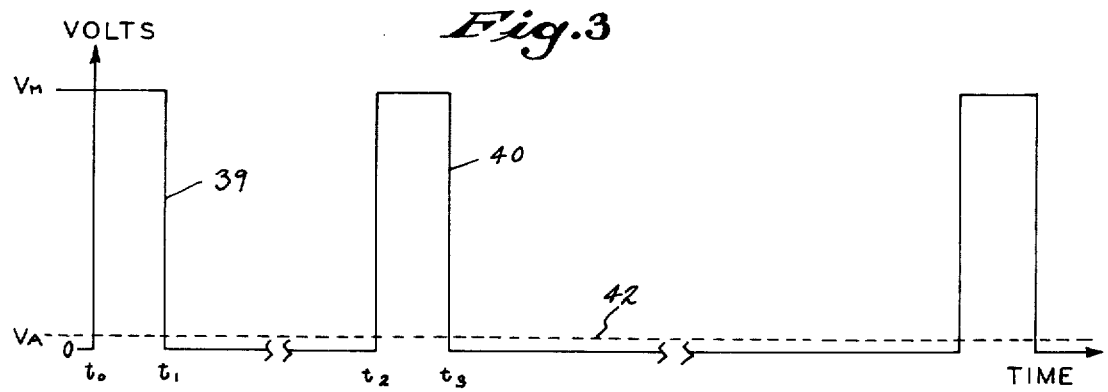
FIG. 3 is a diagrammatical graphical illustration showing a waveform generated by the removable testing system of FIG. 1 in response to sensed gating pulses as illustrated in FIG. 1.

The fast rise time of pulses 37 and 38 occurring at $t_0$ and $t_2$, respectively, render the Darlington circuit 12 conductive or turned "ON" resulting in the Darlington circuit 20 being nonconductive or turned "OFF". With the Darlington circuit 20 in a nonconducting state, the collector circuit 22 is operatively removed from the system neutral 10 so that the diode circuit 26 provides a conducting path from the positive constant voltage source lead 9 to the output lead 35 and digital voltmeter 36 through the selector 31. Thus with the Darlington circuit 12 turned "ON" and the Darlington circuit 20 turned "OFF" in response to a detected gating pulse such as 37, a square wave output pulse 39 of substantial magnitude $V_m$ will be supplied to voltmeter 36 as illustrated in FIG. 3. When the gating pulse 37 decreases in magnitude to a relatively low voltage as at time $t_1$, the Darlington circuit 12 turns "OFF" and Darlington circuit 20 turns "ON" thereby essentially connecting the collector circuit 22 to the system neutral lead 10 and removing the output signal 39 as illustrated at $t_1$ in FIG. 3.

The detector 6 thus provides a stable modified pulse of substantial magnitude in response to each detected gating pulse. The gating pulse 38 similarly produces a square wave pulse 40 of substantial magnitude. The modified pulses 39 and 40 are averaged by the digital voltmeter 36 because of its inability to follow or track the deviations provided by the modified pulses. In operation, the meter 36 responds to the pair of pulses 39 and 40 by providing an averaged output reading Va as illustrated at 42 in FIG. 3.

With both gating pulses 37 and 38 being supplied by the gating control of each selected gating channel of the elevator system and having sufficient magnitude to actuate the Darlington circuit 12, the digital voltmeter 36 will provide the output reading at 42 indicating that the system is operating properly. If only one pulse such as 37 occurs, the digital voltmeter 36 will provide an averaged output of only one-half of the expected magnitude Va thereby indicating a malfunction or circuit failure. If neither pulse 37 or 38 is sensed, the digital voltmeter reading will be zero.

In that the circuit gating connections between the elevator gating control and the elevator bridge circuits 267 and 268 are disconnected, the operation of the gating control under a testing sequence employing the testing module 1 will not operate the elevator system because the gating pulses are not being supplied to the controlled rectifiers within the bridge networks. An operator may conveniently operate the manually operable switches 5 and 31 to quickly and accurately check each gating channel for proper operation. The gating pulse testing circuit 1 may be readily removed following a complete test of the gating circuits and the elevator system activated for operation in a minimal amount of time.

The incorporated MALFUNCTION MONITOR system utilizes a number of wiring harnesses which are interconnected by connector plugs or the like each containing a large number of individual circuits. As diagrammatically illustrated in FIG. 4, a large number of individual input circuits or leads illustrated at 60 are fixedly connected to a connector plug 61. The plug 61 and associated circuits are normally joined with a second group of corresponding electrical conductors as at 62 through a connector plug 63. For normal elevator service, the connector plugs 61 and 63 are joined to provide a continuous electrical circuit between corresponding individual leads 60 and 62. When performing a test upon the elevator system, the plugs 61 and 63 are disconnected with plug 61 joined with a mating test plug 64 and plug 63 joined with a mating test plug 65. Plug 64 fixedly retains a series of individual electrical circuits 66 connected to a portable test module 67 and forming continuous electrical circuits with selected leads from the group 60. The plug 65 likewise fixedly retains a series of electrical circuits 68 connected to the test module 67 and forming continuous electrical circuits with selected leads from the group 62. A series of electrical leads 69 connecting the plugs 64 and 65 essentially provide direct electrical circuits between certain of the leads 60 and 62 thereby by-passing the test module 67.

Figure 4:
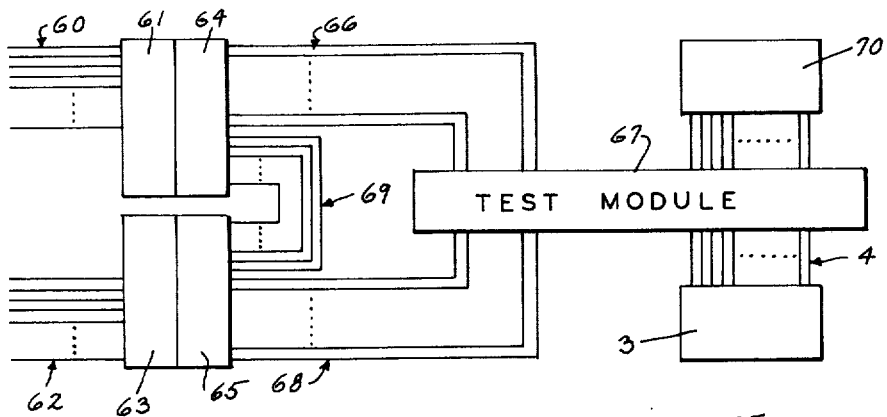
FIG. 4 is a diagrammatical illustration showing a removable test module and associated removable connectors together with connectors fixedly connected to the elevator system.

The gate pulse testing circuit 1 illustrated in FIG. 1 is contained within the test module 67 as illustrated in FIG. 4. Additional connecting plugs such as illustrated at 70 are connected to corresponding mating plugs (not shown) provided by the elevator system for testing a large number of circuits or test points within the elevator system by utilizing the test module 67.

Figure 5:
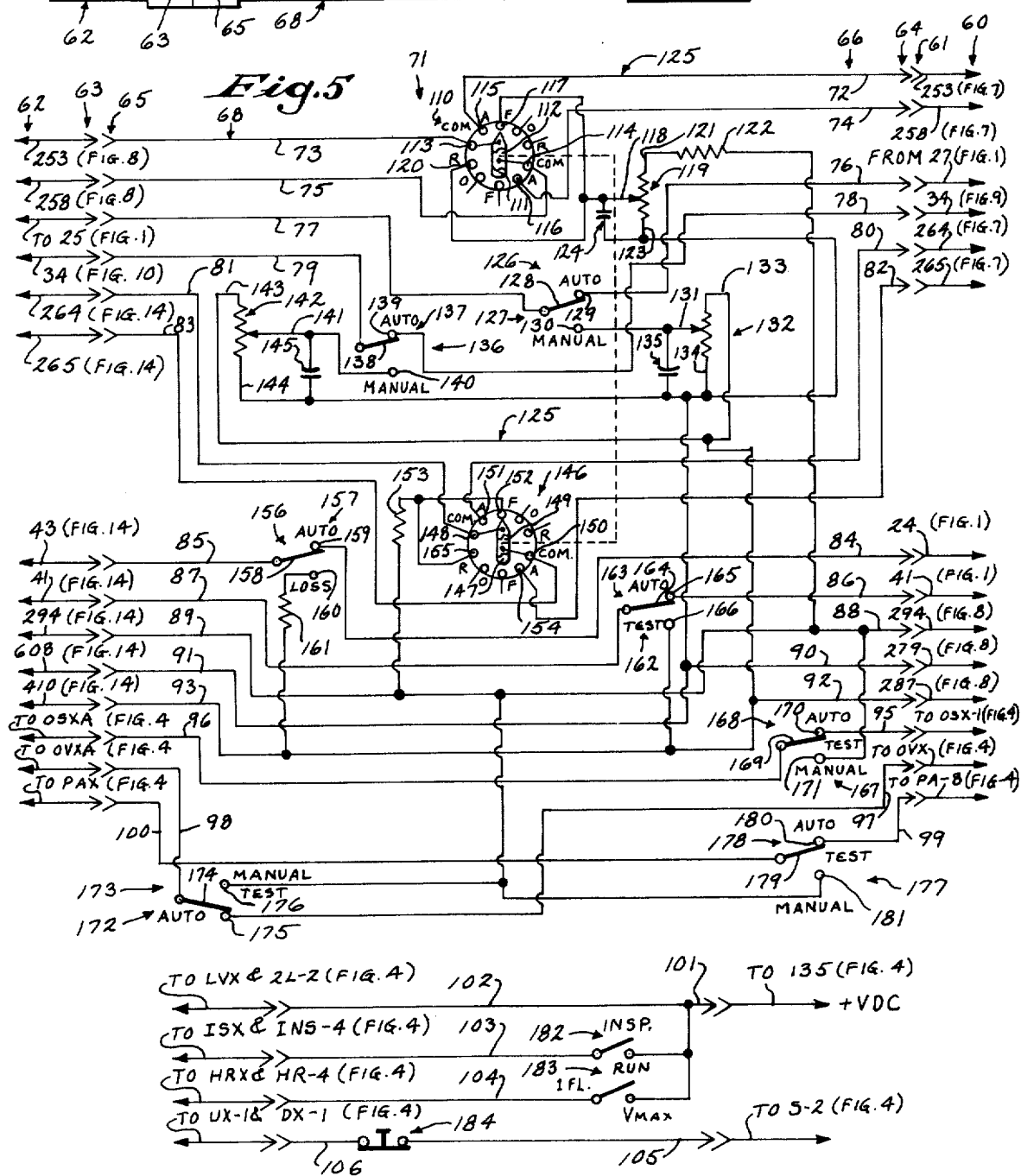
FIG. 5 is an electrical circuit schematic showing a portion of a removable teting system for an elevator.

The digital voltmeter 36 functioning with the test module 67 may be selectively connected through an output circuit 50 shown in FIG. 1 and one or more manually operable selector switches such as diagrammatically illustrated at 51 to monitor various test points within the elevator system. With the switches 5 and 31 positioned at any one of the contacts B-1 through B-10 and A-1 through A-10, one or more similarly constructed selector switches are selectively manually positioned to monitor any one of a number of test points by connecting the digital voltmeter 36 in circuit such as through one or more connector plugs 70. With reference to the incorporated MALFUNCTION MONITOR system, the digital voltmeter 36 may be selectively connected to a large number of test points therein to test the following circuits and/or signals:

The positive potential voltage +VDC by selective connection to lead 135 in FIG. 4;

The overspeed fault auxiliary relay OSXA by selective connection to the input lead thereof at line 111 in FIG. 4;

The over regulation fault auxiliary relay OVXA by selective connection to the input lead thereof at line 112 in FIG. 4;

The potential auxiliary relay PAX by selective connection to the input lead thereof at line 114 in FIG. 4;

The brake lifting proportional voltage signals by selective connection to the output leads 360 and 361 in FIG. 5;

The sensed armature voltage signal by selective connection to lead 181 in FIG. 5;

The generated pattern rate signal by selective connection to lead 191 in FIG. 6;

The generated pattern acceleration signal by selective connection to lead 196 in FIG. 6;

The generated pattern velocity command signal by selective connection to lead 203 in FIG. 6;

The up and down direction command reference signals by selective connection to the input leads connected to contacts DRX-1 and URX-1 in FIG. 6;

The generated leveling command signal by selective connection to lead 235 in FIG. 6;

The sensed velocity signal by selective connection to the input lead 14 in FIG. 6;

The developed error regulation signal by selective connection to lead 17 in FIG. 6;

The sensed armature voltage signal by selective connection to lead 18 in FIG. 7;

The regulated control signal by selective connection to lead 244 in FIG. 7;

The sensed negative armature current signal by selective connection to lead 254 in FIG. 7;

The forward bridge current control signal by selective connection to lead 253 in FIG. 7;

The reverse bridge current control signal by selective connection to lead 258 in FIG. 7;

The forward bridge enable signal by selective connection to lead 264 in FIG. 7;

The reverse bridge enable signal by selective connection to lead 265 in FIG. 7;

The forward and reverse bridge control signals by selective connection to the outputs of resistors 289 and 320 in FIG. 8;

The output pulse control signals supplied to the armature gating pulse transformers for all six dual gating channels by selective connection to the output circuits of the switching circuits, such as at 310 for channel 269 in FIG. 8, for example;

The sensed brake voltage control signal by selective connection to lead 374 in FIG. 9;

The brake gating control signal by selective connection to lead 34 in FIG. 9;

The brake gating control signal by selective connection to lead 34 in FIG. 10;

The output pulse control signal supplied to the brake gating pulse transformer by selective connection to lead 446 in FIG. 10;

The sensed field current signal by selective connection to lead 24 in FIG. 11;

The over-regulation fault signal by selective connection to lead 510 in FIG. 12;

The over-speed regulation signal by selective connection of the circuit 559 in FIG. 13;

The over-speed fault signal by selective connection to circuit 576 in FIG. 13;

The positive unfiltered D.C. voltage signal by selective connection to lead 586 in FIG. 14;

The negative unfiltered D.C. voltage signal by selective connection to lead 588 in FIG. 14;

The emergency signal by selective connection to lead 636 in FIG. 14;

The emergency landing signal by selective connection to the lead 643 in FIG. 14;

The sensed field current signal by selective connection to lead 43 in FIG. 14;

The sensed armature current signal by selective connection to lead 41 in FIG. 14;

The over current fault disable signal by selective connection to lead 668 in FIG. 14;

The forward bridge disable signal by selective connection to lead 621 in FIG. 14;

The line fault disable signal by selective connection to lead 724 in FIG. 14;

The reverse bridge disable signal by selective connection to lead 632 in FIG. 14;

The field control signal by selective connection to the circuit connecting the field control 27 and the field gating circuit 25 in FIG. 1;

The field gating command signal by selective connection to the switching circuit output coupled to the pulse transformer within the field gating circuit 25 in FIG. 1; and Various other circuits throughout the entire elevator control which provide useful information to detect and localize any possible problems within the entire system.

Prior to performing a series of circuit tests upon circuits and signals such as above described, a test circuit control 71 provided by the test module 67 is inserted within or between certain selected control leads within the elevator system. Such a test control circuit 71 is diagrammatically illustrated as being coupled into the elevator system in FIG. 4 such as through the leads 66 and 68 and associated connector plugs 64 and 65, respectively.

The several of the leads 60 and 62 provided by the elevator system as found in the incorporated MALFUNCTION MONITOR system are illustrated in FIG. 5 as removably connected to selected leads 66 and 68 provided by the test module 67. Specifically, a led 72 is selectively connected to the lead 253 supplying the forward bridge current control signal in the incorporated FIG. 7 while a lead 73 is selectively connected with the lead 253 connected to the gating control in the incorporated FIG. 8. A lead 74 is selectively connected with the lead 258 supplying the reverse bridge current control signal in the incorporated FIG. 7 while lead 75 is connected to the lead 258 connected to the gating control in the incorporated FIG. 8. A lead 76 is selectively connected to the field control output 27 supplying the field command signal in the incorporated FIG. 1 and a lead 77 is selectively connected to the input of the field gating circuit 25 in the incorporated FIG. 1. A lead 78 is selectively connected to the lead 34 supplying the brake gating control signal in the incorporated FIG. 9 while a lead 79 is selectively connected to the lead 34 connected to the brake gating circuit in the incorporated FIG. 10. A lead 80 is selectively connected to the lead 264 supplying the forward bridge enable signal in the incorporated FIG. 7 while a lead 81 is selectively connected to the lead 264 connected to the disable control circuits in the incorporated FIG. 14. A lead 82 is selectively connected to the lead 265 and receives the reverse bridge enable signal in the incorporated FIG. 7 while a lead 83 is selectively connected to the lead 265 connected to the bridge disable circuits in the incorporated FIG. 14.

A lead 84 is selectively connected to the field current sensing output 24 in the incorporated FIG. 1 while a lead 85 is selectively connected to the field current lead 43 in the incorporated FIG. 14. A lead 86 is selectively connected to the negative armature current lead 41 in the incorporated FIG. 1 while a lead 87 is selectively connected to the armature current lead 41 in the incorporated FIG. 14. A lead 88 is selectively connected to the constant positive potential voltage lead 294 in the incorporated FIG. 8 while a lead 89 is selectively connected to the positive constant potential lead 294 in the incorporated FIG. 14. A lead 90 is selectively connected to the neutral or ground lead 279 in the incorporated FIG. 8 while a lead 91 is selectively connected to the neutral ground lead 608 in the incorporated FIG. 14. A lead 92 is selectively connected to the negative constant potential voltage lead 287 in the incorporated FIG. 8 while a lead 93 is selectively connected to the negative constant potential voltage lead 410 in the incorporated FIG. 14.

With reference to FIG. 4 of the incorporated MALFUNCTION MONITOR system, the circuit joining the contacts OSX-1 and the overspeed fault auxiliary relay OSXA is open circuited and a lead 95 is selectively connected to the contacts OSX-1 while a lead 96 is selectively connected to the OSXA relay. In a similar manner, the circuit between the contacts OVX-1 and the over regulation fault auxiliary relay OVXA is open circuited and a lead 97 is selectively connected to the contacts OVX-1 while a lead 98 is selectively connected to the OVX relay. Also in a similar manner, the circuit connecting the potential auxiliary relay PAX and the contacts PA-8 is open circuited with a lead 99 selectively connected to contacts PA-8 and a lead 100 selectively connected to the relay PAX. A lead 101 is selectively connected to the positive constant potential voltage source +VDC such as by a connection to lead 135 in the incorporated FIG. 4. The circuit between the contacts 2L-2 and the high speed leveling relay LVX is open circuited and a lead 102 is selectively connected to the LVX relay. In a similar manner, the circuit between the inspection auxiliary relay ISX and the contacts INS-4 is open circuited and a lead 103 is selectively connected to the output lead provided by the ISX relay. The circuit between the high speed auxiliary relay HRX and contacts HR-4 is open circuited and a lead 104 is selectively connected to the output lead provided by the HRX relay. The circuit between the contacts S-2 and the parallel connected contacts and DX-1 in the incorporated FIG. 4 is open circuited with a lead 105 selectively connected to the contacts S-2 and a lead 106 selectively connected to contacts UX-1 and DX-1.

A double deck manually operable switch 110 includes an upper rotatable switch contact arm 111 and a spaced, electrically insulated lower rotatable electrical contact arm 112. The rotatable contact 111 is continuously electrically connected to the lead 73 through the terminal 113 while the rotatable contact 112 is continually electrically connected to the lead 75 through the terminal 114. A forward bridge automatic test terminal 115 is connected to lead 72 while a reverse bridge automatic test terminal 116 is electrically connected to the lead 74. A manual test forward bridge control terminal 117 is electrically connected to a variable tap 118 of a variable potentiometer 119. The variable tap 118 is also electrically connected to a reverse bridge manual test control terminal 120. The rotatable contact 111 is constructed to selectively engage either the terminal 115 for providing an automatic forward bridge test or the terminal 117 for providing a manual forward bridge test while the rotatable contact 112 is positioned to selectively engage either the terminal 116 for providing an automatic reverse bridge test or the terminal 120 for providing a manual reverse bridge test.

The potentiometer 119 provides an output lead 121 which is connected through a resistor 122 to the leads 88 and 89 supplying a constant positive potential signal from the elevator system. Another output lead 123 is connected to the system neutral leads 90 and 91 supplied from the elevator system. A smoothing capacitor 124 is connected between the tap 118 and the neutral lead 123.

The tap 118 of the variable potentiometer 119 is manually adjusted at a test to artificially provide both forward and reverse bridge control signals as controlled through the selector switch 110. Such circuitry thus provides an armature test control 125 and is utilized to selectively test either the forward or reverse current bridges in accordance with artificially induced control signals or automatically under a normal elevator system operation.

A field testing control 126 includes a manually operable switch 127 having a rotatable contact arm 128 electrically connected to the lead 77. The contact arm 128 is rotatable to provide an electrical contact with a terminal 129 connected to the lead 76 for providing an automatic test under normal elevator system operation. Selective connection of contact arm 128 with a terminal 130 provides a manually controllable testing sequence. Specifically, the terminal 130 is electrically connected to a variable tap 131 of a potentiometer 132 having an output lead 133 electrically connected to the leads 92 and 93 supplying a negative constant potential signal from the elevator system. An opposite output lead 134 of potentiometer 132 is connected to the system ground or neutral leads 90 and 91 while a smoothing capacitor 135 is connected between the tap 131 and the neutral lead 134. The tap 131 may thus be selectively adjusted during a testing sequence to artificially induce a field gating command signal with the switch arm 128 engaging the contact 130.

A brake testing control 136 includes a selection switch 137 having a rotatable contact arm 138 electrically connected to the lead 79. The contact 138 is selectively rotated to provide an electrical circuit with a terminal 139 and thus with the lead 78 for an automatic testing operation. The contact arm 138 may alternatively be positioned to contact the manual control terminal 140 which is connected to a variable tap 141 of a variable potentiometer 142. An output lead 143 of potentiometer 142 is connected to the leads 92 and 93 supplying a negative constant potential provided by the elevator system. An output lead 144 is electrically connected to the system neutral or ground leads 90 and 91 while a smoothing capacitor 145 is connected between the variable tap 141 and the neutral lead 144. The tap 141 may thus be selectively adjusted during a testing sequence to artificially impose a brake gating command signal with the switch arm 138 engaging the contact 140.

A rotatable switch 146 also forms a portion of the armature control 125 and is constructed in a manner similar to that as described with respect to the rotatable switch 110. In this regard, an upper rotatable switch arm 147 is permanently electrically connected to lead 81 through a terminal 148 while the spaced, electrically insulated selector switch arm 149 is permanently electrically connected to the lead 83 through a terminal 150. The rotatable contact 147 may be selectively rotated to provide electrical connection with the automatic testing terminal 151 connected to the lead 80 or with the manual testing sequence terminal 152 connected to the positive constant potential leads 88 and 89 through a resistor 153.

In a similar manner, the rotatable lower contact arm 149 may be selectively electrically connected to the automatic testing terminal 154 connected to lead 82 or to the manual testing terminal 155 connected to resistor 153 for receiving a constant positive potential signal thereat. The operation of the selector switch 146 thus supplies the enable signals to the gating control circuits within the elevator system in accordance with the desired testing sequence. Thus under a manual testing sequence, the forward or reverse bridges may be artificially selectively enabled.

A field loss testing control circuit 156 includes a switch 157 having a rotatable electrical contact 158 electrically connected to the lead 85. The contact 158 may be selectively positioned to provide an electrical connection with a terminal 159 connected to the lead 84 for an automatic testing sequence. Alternatively, the electrical contact 158 may be connected to a terminal 160 for super-imposing a field loss condition upon the system. The terminal 160 is connected to the negative constant potential leads 92 and 93 through a resistor 161. An operator may therefore artificially create a field loss condition upon the elevator system during the manual testing sequence.

An armature testing control circuit 162 includes a manually operable switch 163 having a rotatable contact arm 164 electrically connected to the lead 87. The contact arm 164 may be selectively positioned to provide an electrical connection with a terminal 165 electrically connected to the lead 86 for an automatic testing sequence. Alternatively, the switch arm 164 may be electrically connected to a terminal 166 directly connected to the constant negative potential leads 92 and 93 for super-imposing an armature current malfunction to the elevator system. An operator may therefore artificially create an armature over-current condition upon the elevator system during a manual testing sequence.

An over speed testing control 167 includes a manually operable switch 168 having a rotatable contact arm 169 electrically connected to the lead 96. The switch arm 169 may be selectively positioned to form an electrical contact with a terminal 170 electrically connected to the lead 95 for an automatic testing sequence. Alternatively, the switch arm 169 may be electrically connected to a terminal 171 electrically connected to the leads 88 and 89 supplying a constant positive potential signal to energize the OSXA relay for super-imposing a pre-condition of normal operation thereat. The switch arm 169 may also be placed at a neutral position spaced from terminals 170 and 171 to thereby open circuit the OSX relay and super-impose an artificial overspeed malfunction condition upon the elevator system under a manual testing sequence.

An over regulation fault testing control 172 includes a manually operable switch 173 having a rotatable contact arm 174 electrically connected to the lead 98. The switch arm 174 may be positioned to provide an electrical circuit with a terminal 175 electrically connected to the lead 97 for providing an automatic testing sequence. Alternatively, the switch arm 74 may be positioned to provide an electrical connection with a terminal 176 electrically connected to the constant positive potential leads 88 and 89 to energize the OVXA relay and super-impose an under-regulation condition indicating a proper operation of the elevator system. Alternatively, the switch arm 174 may be selectively positioned between terminals 175 and 176 to thereby open circuit the OVXA relay to super-impose an artificial overregulation condition upon the elevator system during the manual testing sequence.

A potential auxiliary testing control 177 includes a three position switch 178 having a rotatable switch arm 179 electrically connected to the lead 100. The switch arm 179 may be rotated to form an electrical circuit with a terminal 180 electrically connected to the lead 99 for providing an automatic testing sequence. Alternatively, the switch arm 179 may be rotated to make an electrical circuit with a terminal 181 connected to the leads 88 and 89 providing a constant positive potential signal for energizing the PAX relay and super-imposing a proper operating potential condition upon the sensing circuits of the elevator system. The switch arm 179 may be positioned in a neutral location spaced between the contacts 180 and 181 to thereby open circuit the PAX relay to super-impose an artificial system malfunction indicating a failure of the power control equipment within the elevator system.

The circuit provided by the leads 101 and 102 when interconnected by the testing sequence provides continuous energization of the high speed leveling relay LVX to thereby artificially remove the leveling pattern control from consideration during the test. A manually operable switch 182 permits the selective energization or de-energization of the inspection auxiliary relay ISX. With switch 182 closed, the relay ISX remains energized to artificially create a normal speed operation. With switch 182 open, the relay ISX is de-energized to artificially create an inspection speed operation. A manually operable switch 183 is selectively controlled to energize or de-energize the high speed auxiliary relay HRX. With switch 183 closed, the relay HRX remains energized to artificially provide a high speed run sequence. With switch 183 open, the relay HRX remains de-energized to artificially command a one floor run speed. A normally closed manually operable switch 184 is connected in circuit between the leads 105 and 106 and is selectively operated to de-energize the up and down direction starting relays URX and DRX to artificially induce an accelerating or decelerating command to or from a leveling speed within the elevator sequence under a manual testing sequence.

The operation of the field control under test as above described in the incorporated MALFUNCTION MONITOR system is more fully set forth in the application having Ser. No. 468,864 now U.S. Pat. No. 3,938,624 filed on May 10, 1974 by J. Maynard, entitled TRANSPORTATION SYSTEM WITH MOTOR FIELD CONTROL, and such aplication is incorporated by reference herein.

The testing control circuits 71 within the test module 67 may be interconnected within an elevator system so as to provide a wide variety of tests while the elevator system provides normal, automatic operation. While under test, any one of a number of artificially induced contitions may be selectively superimposed upon the operating elevator system while a series of signals and circuits are selectively monitored as they respond to the artificially induced condition. The testing system of the present invention can be easily and quickly connected and disconnected within an elevator system with a minimum of down time.

While the testing system provides a wide range of tests and features, certain sequences and circuits have been found to be extremely desirable in testing elevators which employ static power converters for selectively energizing A.C. or D.C. motors controlling the movement of an elevator car.

Various modes of carrying out the invention are contemplated as being within the scope of the following claims particularly pointing out and distinctly claiming the subject matter which is regarded as the invention.

We claim:

1. A testing system removably connected to an elevator system having a control circuit selectively supplying gating pulses to gated rectifying means operatively supplying controlled amounts of energy from an energy source to motive means operating an elevator car, comprising input means removably connected to said control circuit and electrically sensing said gating pulses, conditioning means connected to said input means and providing a pulse having a substantially uniform magnitude in response to each of said sensed gating pulses, and means connected to said conditioning means and providing an output representing the substantial average of said uniform pulses over a predetermined period of time.

2. A testing system removably connected to an elevator system having a control circuit selectively supplying first and second gating pulses during each electrical cycle of an alternating energy source to gated rectifying means operatively supplying controlled amounts of energy from said energy source to motive means operating an elevator car, comprising input means removably connected to said control circuit and electrically sensing said first and second gating pulses, conditioning means connected to said input means and providing a pulse having a substantially uniform magnitude in response to each of said sensed first and second gating pulses, and means connected to said conditioning means and providing a first predetermined magnitude output in response to the sensing of said first and second gating pulses and a second predetermined magnitude output different from said first output in response to the absence of at least one of said first and second gating pulses.

3. A testing system removably connected to an elevator system having a control circuit and a first releasable connector having first and second mating terminals with said first terminal connected to said control circuit and said second terminal connected to selectively supply first and second gating pulses during each electrical cycle of an alternating energy source to gated rectifying means operatively supplying controlled amounts of energy from said energy source to motive means operating an elevator car, comprising a third terminal removably connected with said first terminal and providing a second releasable connector forming an electrical input circuit sensing said first and second gating pulses, a conditioning circuit connected to said input circuit and including a first switching circuit transferring from a first condition to a second condition in response to one of said sensed first and second pulses and transferring from said second condition to said first condition in response to the absence of said sensed first and second pulses and a second switching circuit connected to said first switching circuit and transferring from a first condition to a second condition in response to the second condition of said first switching circuit and providing a first substantially constant magnitude output, said second switching circuit transferring to said first condition in response to the first condition of said first switching circuit and providing a second substantially constant magnitude output different from said first output, and a meter connected to said conditioning circuit and providing a constant output reading representing the substantial average of said first and second substantially constant outputs during each electrical cycle.

4. A testing system removably connected to an elevator system having motive means operating an elevator car and control means including a closed loop control operatively receiving an output proportional signal from means responsive to an output of said motive means and operatively supplying controlled amounts of energy from an energy source to said motive means and moving said elevator car in response to a control signal within said control means, said control means including circuit means removably connecting first and second circuits providing control of said motive means, comprising means including a test control circuit removably connected to said circuit means and providing an artificial control signal characteristic of an operating condition of said elevator system and controlling the operation of said motive means, and means removably connected to said control means and monitoring said control signal with said elevator system operating in response to said artificial control signal.

5. The testing system of claim 4, wherein said control means includes gated rectifying means operatively supplying controlled amounts of energy between said source and said motive means, said test control circuit selectively supplying an artificial gate firing control signal and operating said gated rectifying means.

6. The testing system of claim 5, wherein said gated rectifying means includes a first direction circuit and a second direction circuit, and said test control circuit including switch means selectively providing said artificial gate firing control signal independently to said first and second direction circuits.

7. The testing system of claim 5, wherein said gated rectifying means is connected to provide varied controlled amounts of energy to an armature circuit of said motive means in response to means selectively varying said artificial control signal.

8. The testing system of claim 5, wherein said gated rectifying means is connected to provide varied controlled amounts of energy to a field circuit of said motive means in response to means selectively varying said artificial control signal.

9. The testing system of claim 4, wherein said control means includes gated rectifying means operatively supplying controlled amounts of energy between said source and said motive means, said test control circuit selectively supplying an artificial enable control signal permitting selective operation of said gated rectifying means.

10. The testing system of claim 9, wherein said gated rectifying means includes a first direction circuit and a second direction circuit, and said test control circuit including switch means selectively providing said artificial enable control signal independently to said first and second direction circuits.

11. The testing system of claim 10, wherein said gated rectifying means is connected to provide varied controlled amounts of energy to an armature circuit of said motive means and said artificial enable control signal supplied by said test control circuit only to a selected one of said first and second direction circuits and controlling the operating direction of said car.

12. The testing system of claim 4, wherein said motive means includes an armature circuit connected to receive said controlled amounts of energy, said test control circuit selectively supplying an artificial armature over-current control signal to said operating elevator system and artificially creating a malfunction condition.

13. The testing system of claim 4, wherein said motive means includes a field circuit connected to receive said controlled amounts of energy, said test control circuit selectively supplying an artificial energy loss control signal to said operating elevator system and artificially creating a malfunction condition.

14. The testing system of claim 4, wherein said control means includes a power control circuit selectively supplying operating power to a plurality of control circuits within said control means and controlling elevator operation, said test control circuit selectively supplying an artificial power loss control signal to said operating elevator system and artificially creating a malfunction condition.

15. The testing system of claim 4, wherein said control means includes a power control circuit selectively supplying operating power to a plurality of control circuits within said control means and controlling elevator operation, said test control circuit selectively supplying an artificial power control signal to said operating elevator system and artificially signalling a proper operating power condition.

16. The testing system of claim 4, wherein said output proportional signal is related to the velocity of said car, said test control circuit selectively supplying an artificial excessive speed control signal to said operating elevator system and artificially creating a malfunction condition.

17. The testing system of claim 4, wherein said output proportional signal is related to the velocity of said car, said test control circuit selectively supply an artificial speed control signal to said operating elevator system and artificially signalling a proper velocity condition of said operating car.

18. The testing system of claim 4, wherein said control means includes command means providing a command signal indicative of a desired operation of said elevator car and means responding to said command signal and said output proportional signal and providing an error signal operatively coupled to control the operation of said car, said test control circuit selectively supplying an artificial excessive error signal to said operating elevator system and artificially creating a malfunction condition.

19. The testing system of claim 4, wherein said control means includes command means providing a command signal indicative of a desired operation of said elevator car and means responding to said command signal and said output proportional signal and providing an error signal operatively coupled to control the operation of said car, said test control circuit selectively supplying an artificial error signal to said operating elevator system and artificially signalling a proper error signal condition.

20. The testing system of claim 4, wherein said control means includes a selectively operable leveling pattern control circuit operatively controlling the stopping of said car at a landing, said test control circuit removably supplying an artificial disable signal operatively removing said leveling pattern control circuit from controlling a stopping sequence of said elevator car.

21. The testing system of claim 4, wherein said control means includes a velocity command circuit selectively commanding a multi-floor run velocity, said test control circuit selectively supplying an artificial velocity command signal commanding a multi-floor run velocity.

22. The testing system of claim 4, wherein said control means includes a velocity command circuit selectively commanding a one-floor run velocity, said test control circuit selectively supplying an artificial velocity command signal commanding a one-floor run velocity.

23. The testing system of claim 4, wherein said control means includes a normal run selection circuit selectively commanding a normal run sequence, said test control circuit selectively supplying an artificial command signal commanding a normal run sequence.

24. The testing system of claim 4, wherein said control means includes an inspection run selection circuit selectively commanding an inspection run sequence, said test control circuit selectively supplying an artificial command signal commanding an inspection run sequence.

25. The testing system of claim 4, wherein said control means includes a selectively operable acceleration command circuit operatively controlling the acceleration of said car, said test control circuit selectively supplying an artificial acceleration command signal operatively controlling the operation of said acceleration command circuit.

26. The testing system of claim 4, wherein said control means includes a selectively operable deceleration command circuit operatively controlling the deceleration of said car, said test control circuit selectively supplying an artificial deceleration command signal operatively controlling the operation of said decelerating command circuit.

27. A testing system removably connected to an elevator system having control means including a malfunction monitor operatively controlling the amount of energy supplied from an energy source to motive means operatively controlling an elevator car, said control means including circuit means removable connecting first and second circuits providing control of said motive means, comprising means including a test control circuit removably connected to said circuit means and providing an artificial control signal characteristic of a malfunction condition of said elevator system and controlling the operation of said motive means, and means removably connected to said control means and monitoring a control signal within said control means with said elevator system operating in response to said artificial control signal.

28. A testing system removably connected to an elevator system having motive means operating an elevator car and control means including first and second circuits removably connected and providing a closed loop control circuit operatively receiving an output proportional signal from means responsive to an output of said motive means and operatively supplying controlled amounts of energy from an energy source to said motive means and moving said elevator car in response to a control signal within said control means, comprising means including a test control circuit having a third circuit removably connected to said first circuit and a fourth circuit removably connected to said second circuit and selectively operative between a first condition completing said closed loop control circuit and a second condition introducing an artificial control signal characteristic of an operating condition of said elevator system and controlling the operation of said motive means, and means removably connected to said control means and monitoring said control signal with said elevator system operating in response to said closed loop control circuit and with said elevator system operating in response to said artificial control signal.

29. A testing system removably connected to an elevator system having motive means moving an elevator car, braking means including a selectively operable braking element permitting vehicle movement and retaining said car in a stopped position, and control means operating in response to a control signal and selectively operating said motive means and selectively supplying energy from an energy source to said braking means, said control means including circuit means removably connecting first and second circuits providing control of said braking means, comprising means including a test control circuit removably connected to said circuit means and providing an artificial control signal characteristic of an operating condition of said elevator system and controlling the operation of said braking means, and means removably connected to said control means and monitoring said control signal with said elevator system operating in response to said artificial control signal.

30. The testing system of claim 29, wherein said control means includes gated rectifying means operatively supplying controlled amounts of energy between said source and said braking means, said test control circuit selectively supplying an artificial gate firing control signal and operating said gated rectifying means.

31. The testing system of claim 30, wherein said gated rectifying means is connected to provide selectively variable controlled amounts of energy to a coil coupled to control said braking element, said test control circuit having means selectively varying said artificial control signal and correspondingly varying the energy supplied to said coil.

* * * * *

UNITED STATES PATENT AND TRADEMARK OFFICE
CERTIFICATE OF CORRECTION

PATENT NO. : 4,002,973
DATED : January 11, 1977
INVENTOR(S) : THEODORE O. WIESENDANGER & JOHN V. SEALS It is certified that error appears in the above-identified patent and that said Letters Patent are hereby corrected as shown below:

Column 6, Line 7, After "illustrated in" delete "Fig 1" and substitute therefor ---Fig. 2---

Column 6, Line 13, Delete "teting" and substitute therefor ---testing---

Column 6, Line 18, Delete "connectd" and substitute therefor ---connected---

Column 11, Line 47, Delete "led" and substitute therefor ---lead---

Column 12, Line 55, After "contacts" and before "and" add ---UX-1---

Column 15, Line 45, After "normal" and before "speed" add ---run---

Column 18, Line 53 In the Claims, Delete "supply" and substitute therefor ---supplying---

Signed and Sealed this

Twentieth Day of March 1979

[SEAL]

Attest:

RUTH C. MASON
Attesting Officer

DONALD W. BANNER
Commissioner of Patents and Trademarks